(12) United States Patent
Asako

(10) Patent No.: US 9,892,934 B2
(45) Date of Patent: Feb. 13, 2018

(54) METHOD FOR REMOVING HALOGEN AND METHOD FOR MANUFACTURING SEMICONDUCTOR DEVICE

(71) Applicant: TOKYO ELECTRON LIMITED, Tokyo (JP)

(72) Inventor: Ryuichi Asako, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/245,335

(22) Filed: Aug. 24, 2016

(65) Prior Publication Data

US 2017/0062237 A1 Mar. 2, 2017

(30) Foreign Application Priority Data

Aug. 31, 2015 (JP) ................. 2015-170873

(51) Int. Cl.
*H01L 21/321* (2006.01)
*H01L 21/3213* (2006.01)
*H01L 21/3105* (2006.01)

(52) U.S. Cl.
CPC .... *H01L 21/32138* (2013.01); *H01L 21/3105* (2013.01); *H01L 21/321* (2013.01)

(58) Field of Classification Search
CPC ............ H01L 21/32138; H01L 21/321; H01L 21/3105

See application file for complete search history.

(56) References Cited

U.S. PATENT DOCUMENTS

2009/0192065 A1*  7/2009  Korzenski ............... C11D 7/08
510/176

FOREIGN PATENT DOCUMENTS

| JP | 3-25934 A | 2/1991 |
|---|---|---|
| JP | 5-326477 A | 12/1993 |
| JP | 10-189554 A | 7/1998 |
| JP | 2005-26277 A | 1/2005 |
| KR | 10-2011-0063774 A | 6/2011 |

* cited by examiner

*Primary Examiner* — Nadine Norton
*Assistant Examiner* — Mahmoud Dahimene
(74) *Attorney, Agent, or Firm* — Nath, Goldberg & Meyer; Jerald L. Meyer

(57) ABSTRACT

A method of removing a halogen includes performing a heating treatment on a halogen-containing film at a pressure higher than 1 atm and a temperature higher than 100 degrees C. in order to suppress a deterioration of the halogen-containing film while keeping an organic solvent, which is in a liquid phase and exhibits a polarity, in contact with a surface of the halogen-containing film.

21 Claims, 16 Drawing Sheets

FIG. 6

Heat treatment flow →

| Sample No. | First treatment | | | Cooling & solvent exchange | Second treatment | | | Cooling & solvent exchange | Third treatment | | | Dry |
|---|---|---|---|---|---|---|---|---|---|---|---|---|
| | Solvent | Processing condition | | | Solvent | Processing condition | | | Solvent | Processing condition | | |
| 1 | Pure water | 2~3atm, 120°C, 12hours | | | Pure water | 2~3atm, 120°C, 12hours | | | Pure water | 2~3atm, 120°C, 12hours | | Dry |
| 2 | Methanol | 2~3atm, 120°C, 12hours | | | Methanol | 2~3atm, 120°C, 12hours | | | Methanol | Atmospheric pressure (1atm), 50°C, About 10 minutes (cleaning treatment) | | |
| 3 | Pure water | 2~3atm, 120°C, 36hours | | | | | | | | | | Dry |

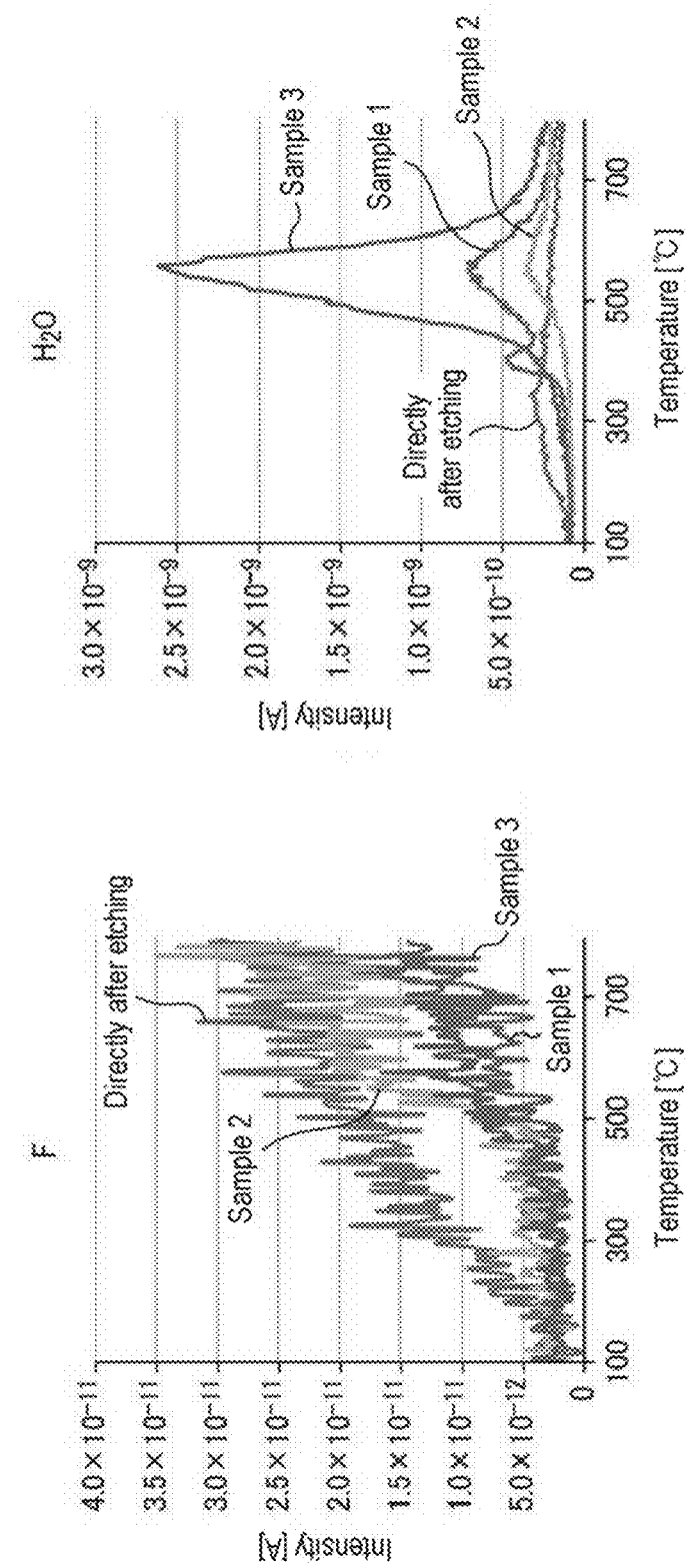

FIG. 11

| Sample No. | First treatment | | Cooling & solvent exchange | Second treatment | | Cooling & solvent exchange | Third treatment | | Dry |
|---|---|---|---|---|---|---|---|---|---|
| | Solvent | Processing condition | | Solvent | Processing condition | | Solvent | Processing condition | |
| 4 | IPA | 2~3atm, 120°C, 12hours | | IPA | 2~3atm, 120°C, 12hours | | Pure water | Atmospheric pressure (1atm), 50°C, About 10 minutes (cleaning treatment) | |

Heat treatment flow →

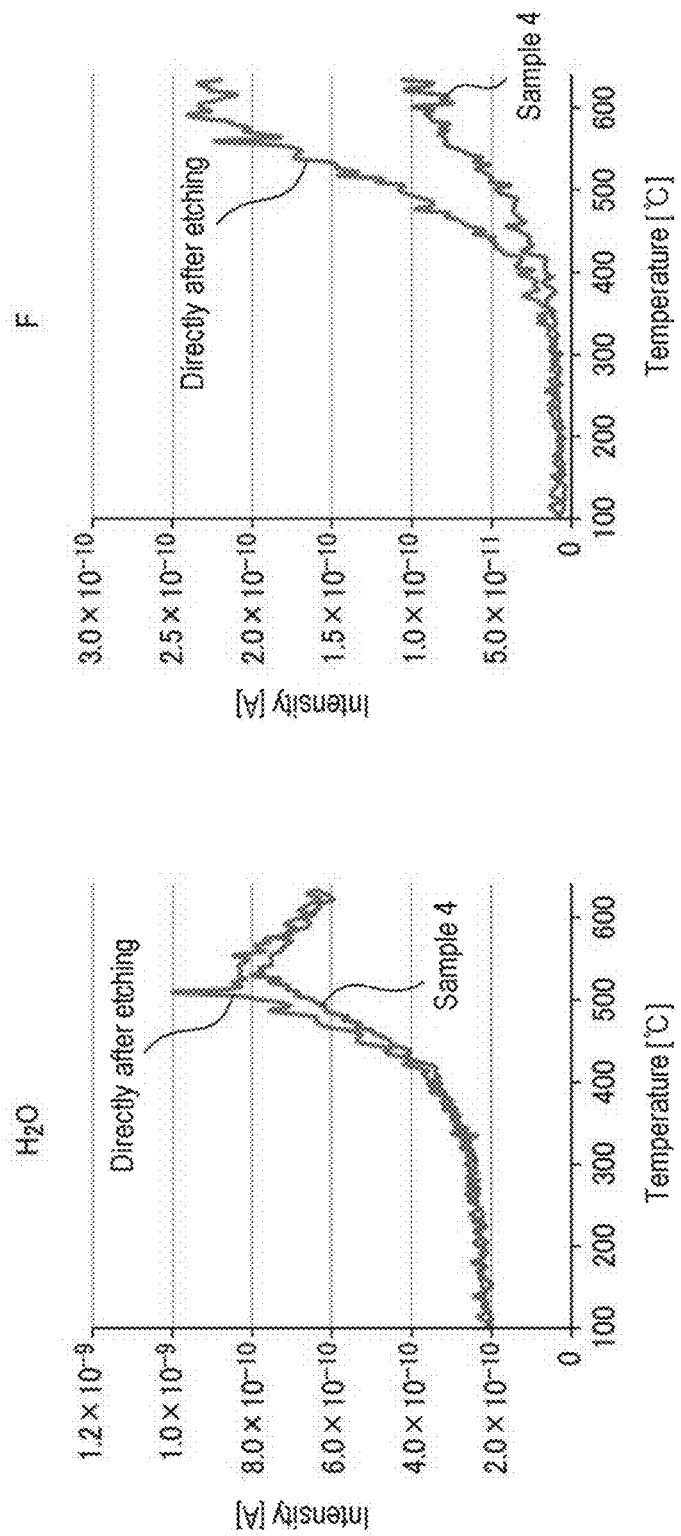

FIG. 14

Heat treatment flow →

| Sample No. | First treatment | | Cooling & solvent exchange | Second treatment | | Cooling & solvent exchange | Third treatment | | Dry |
| --- | --- | --- | --- | --- | --- | --- | --- | --- | --- |
| | Solvent | Processing condition | | Solvent | Processing condition | | Solvent | Processing condition | |
| 5 | Methanol | 2~3atm, 120℃, 12hours | | Methanol | 2~3atm, 120℃, 12hours | | Pure water | Atmospheric pressure(1atm), 50℃, About 10 minutes (cleaning treatment) | |
| 6 | IPA | 2~3atm, 120℃, 12hours | | IPA | 2~3atm, 120℃, 12hours | | Pure water | Atmospheric pressure(1atm), 50℃, About 10 minutes (cleaning treatment) | |
| 7 | IPA | 2~3atm, 120℃, 24hours | | IPA | 2~3atm, 120℃, 24hours | | Pure water | Atmospheric pressure(1atm), 50℃, About 10 minutes (cleaning treatment) | |

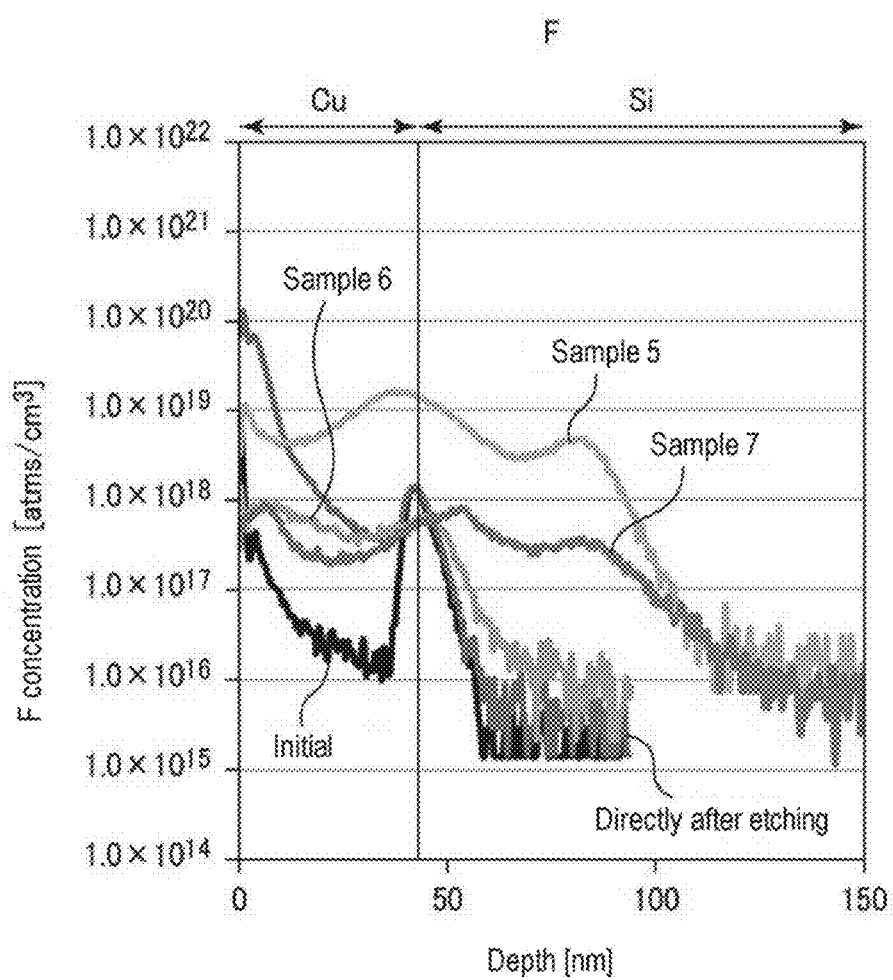

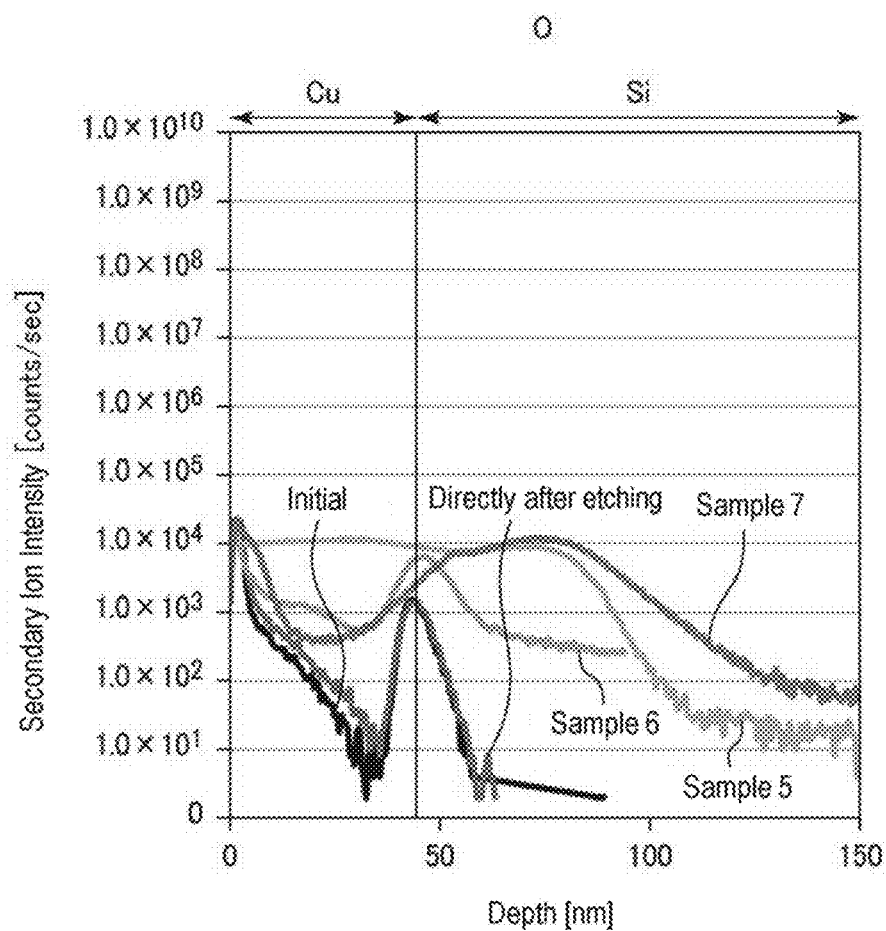

METHOD FOR REMOVING HALOGEN AND METHOD FOR MANUFACTURING SEMICONDUCTOR DEVICE

CROSS-REFERENCE TO RELATED APPLICATION(S)

This application claims the benefit of Japanese Patent Application No. 2015-170873, filed on Aug. 31, 2015 in the Japan Patent Office, the disclosure of which is incorporated herein in its entirety by reference.

TECHNICAL FIELD

The present disclosure relates to a method for removing a halogen, such as fluorine, which remains in a film when the film has been processed by a gas containing the halogen, and a method for manufacturing a semiconductor device.

BACKGROUND

In a semiconductor device manufacturing process, plasma etching is performed on an etching target film such as an interlayer insulating film formed on a semiconductor wafer by using a photoresist film as a mask so as to form a predetermined pattern, and then a metal, such as Cu or the like, is buried to thereby form wiring.

Since a fluorine-containing gas is used in the plasma etching process, a fluorine-containing material is attached to the etching tar film, and fluorine also remains inside the etching target film or within a lower wiring. Since the reliability of a semiconductor device is degraded when fluorine remains therein, reducing the residual amount of the fluorine is required.

The fluorine-containing material attached to the etching target film or the like may be removed partly by an ashing treatment or cleaning treatment. However, it is difficult to remove fluorine, which penetrates into a film, through the ashing treatment or the cleaning treatment. In addition, using an etching gas containing another halogen, such as chlorine, may also adversely affect the device considerably. Like the fluorine, it is difficult to remove chlorine or the like, which penetrates into the film.

Additionally, techniques for removing a halogen, such as fluorine, have been known. For example, a technique of removing the halogen by heating a halogen atom adsorption layer or a halogen compound adsorption layer formed on a solid surface within a vacuum apparatus is known. In addition, there is a technique of making a process chamber accommodating a semiconductor substrate to be treated into an ultra-high vacuum, then introducing a small amount of hydrogen gas into the process chamber, and performing a heat-treatment on the semiconductor substrate at a temperature of about 300 degrees C. while maintaining the hydrogen pressure at $10^{-5}$ to $10^{-4}$ torr. In addition, the procedure of removing residual fluorine contaminant on a metal surface after ashing by exposing the residual fluorine contaminant to $NH_3/O_2$ plasma has been used.

However, all the techniques perform a treatment in a gas, which is effective in removing a halogen of a film surface, but it is difficult to effectively remove a halogen which penetrate into the film. In addition, the film may deteriorate when plasma is used, and a low dielectric constant (Low-k) film, which has been recently frequently used as an interlayer insulating film which is an etching target film, is a film to be subjected to halogen removal.

SUMMARY

Accordingly, the present disclosure provides a method of removing a halogen that is capable of removing, for a halogen containing film, a halogen inside the film while suppressing the degradation of the film. The present disclosure also provides a method for manufacturing a semiconductor device using the method of removing a halogen.

According to one embodiment of the present disclosure, there is provided a method of removing a halogen, including: performing a heating treatment on a halogen-containing film at a pressure higher than 1 atm and a temperature higher than 100 degrees C. in order to suppress a deterioration of the halogen-containing film while keeping an organic solvent, which is in a liquid phase and exhibits a polarity, in contact with a surface of the halogen-containing film.

According to embodiment of the present disclosure, there is provided a method of manufacturing a semiconductor device, including: preparing a structure having a predetermined film formed on a semiconductor substrate; performing plasma etching using a fluorine-containing gas on the predetermined film; and removing fluorine contained in the predetermined film by the plasma etching, wherein removing the fluorine performs a heating treatment on the predetermined film at a pressure higher than 1 atm and a temperature higher than 100 degrees C. in order to suppress a deterioration of the predetermined film while keeping an organic solvent, which is in a liquid phase and exhibits a polarity, in contact with a surface of the predetermined film.

According to yet another embodiment of the present disclosure, there is provided a method of manufacturing a semiconductor device, including: preparing a structure having a lower Low-k film and a lower Cu wiring formed on a semiconductor substrate, and an upper Low-k film formed thereon as an etching target film; performing plasma etching using a fluorine-containing gas on the upper Low-k film; and removing fluorine contained in the upper Low-k film and the lower Cu wiring by the plasma etching, wherein removing the fluorine performs a heating treatment on the upper Low-k film and the lower Cu wiring at a pressure higher than 1 atm and a temperature higher than 100 degrees C. in order to suppress a deterioration of the upper Low-k film and the lower Cu wiring while keeping an organic solvent, which is in a liquid phase and exhibits a polarity, in contact with a surface of the upper Low-k film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a diagram showing heating treatment conditions of Samples 1 to 3 in Experiment Example 1.

FIGS. 7A and 7B are diagrams showing results that were obtained by measuring a degassing amount of fluorine F and a degassing amount of water ($H_2O$) to a temperature by a temperature rising desorption gas analyzer with respect to Samples 1 to 3 in Experiment Example 1 and a sample directly after etching.

FIG. 11 is a diagram showing heating treatment conditions of Sample 4 in Experiment Example 2.

FIGS. 13A and 13B are diagrams showing results that were obtained by measuring a degassing amount of fluorine F and a degassing amount of water ($H_2O$) to a temperature by a temperature rising desorption gas analyzer with respect to Sample 4 in Experiment Example 2 and a sample directly after etching.

FIG. 14 is a diagram showing heating treatment conditions of Samples 5 to 7 in Experiment Example 3.

FIG. 15 is a diagram showing results that were obtained by measuring a fluorine (F) concentration in a depth direction by an SIMS with respect to Samples 5 to 7 in Experiment Example 3, an initial sample before etching, and a sample after etching.

FIG. 16 is a diagram showing results that were obtained by measuring an oxygen (O) concentration in a depth direction by an SIMS with respect to Samples 5 to 7 in Experiment Example 3, an initial sample before etching, and a sample after etching.

DETAILED DESCRIPTION

Hereinafter, embodiments of the present disclosure will be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A first embodiment will be described first.

Figure 1:
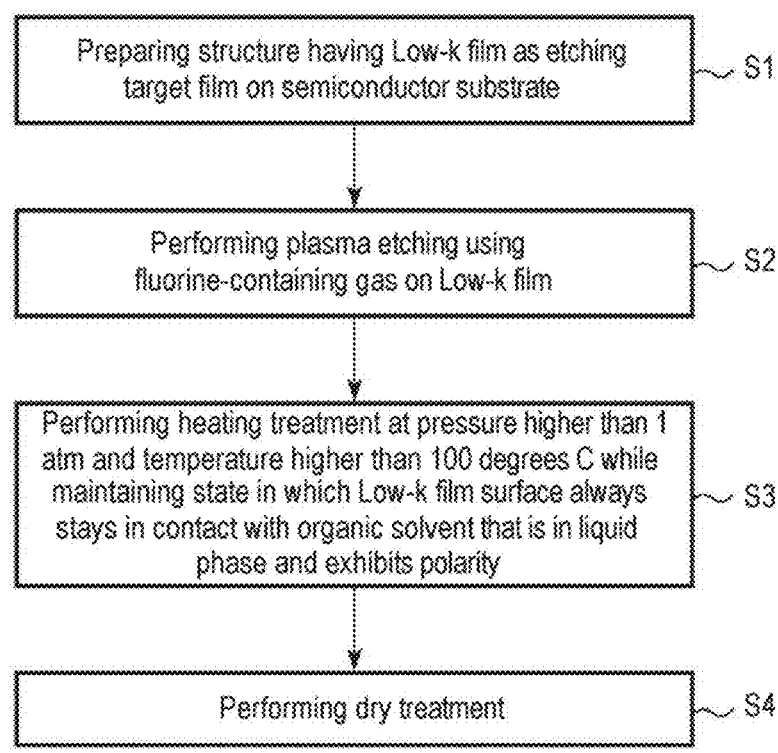
FIG. 1 is a flowchart illustrating a halogen removing method according to a first embodiment of the present disclosure.

FIG. 1 is a flowchart illustrating a halogen removing method according to a first embodiment of the present disclosure.

In a first embodiment, a structure having a Low-k film such as an etching target film on a semiconductor substrate is prepared (Step S1), and plasma etching using a fluorine-containing gas is performed on the Low-k film (Step S2).

By the etching treatment, an etching deposition containing fluorine is formed on the Low-k film surface, and fluorine is diffused in the Low-k film, so that fluorine remains in the film.

The Low-k film contains Si, and typically includes SiOC, SiCHO, and SiOF. In addition, as the fluorine-containing gas to be used as an etching gas, there may be an ordinary F-containing gas (e.g., a $C_xF_y$ series gas, such as $CF_4$ or $C_4F_8$), which is not particularly limited thereto.

Subsequently, a heat treatment is performed at a pressure higher than 1 atm ($1.01 \times 10^5$ Pa) and a temperature higher than 100 degrees C. while maintaining a state in which the Low-k film surface stays in contact with an organic solvent that is in a liquid phase and exhibits a polarity (Step S3).

Figure 2:
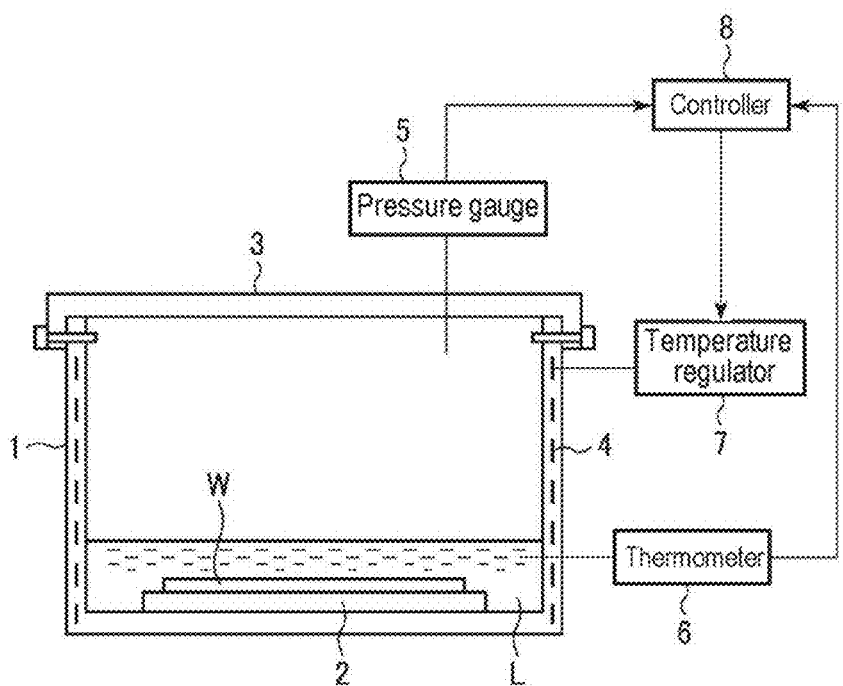
FIG. 2 is a sectional view illustrating an exemplary apparatus for performing a heating treatment by a solvent.

More specifically, as illustrated in FIG. 2, a semiconductor substrate W having a Low-k film is mounted on a holding table 2 provided within the container 1, an organic solvent L that is in a liquid phase and exhibits a polarity is introduced into a container (autoclave) 1 such that the semiconductor substrate W is immersed in the organic solvent. A cover 3 is fixed to the container 1 using a screw or the like, and then a heat treatment is performed by a heater 4 within the container 1. The heater may be wound around the outside of the container 1. The pressure within the container 1 is measured using a pressure gauge 5 and the temperature within the container 1 is adjustable by a temperature regulator 7 while measuring the temperature using a thermometer 6, in addition, the heat treatment is performed for a predetermined time duration while performing a control by a controller 8 such that the temperature of the solvent is 100 degrees C. or higher at a pressure higher than 1 atm ($1.01 \times 10^5$ Pa). At this time, the Low-k film always stays in contact with a solvent in a liquid phase.

By this, the fluorine inside the film is removed through diffusion of fluorine to the solvent without using a chemical reaction. The migration of fluorine from a Low-k film into a solvent is hardly caused tinder room temperature and atmospheric pressure. However, when the organic solvent exhibiting a polarity is maintained at a temperature of 100 degrees C. or higher in a compressed state while being maintained in the liquid phase, the diffusion rate of the fluorine inside the Low-k film into the organic solvent exhibiting a polarity is increased so that the fluorine inside the Low-k film can be eluted within a relatively short time. As long as the organic solvent maintains the liquid phase, the diffusion rate is increased at a higher temperature and pressure so that the fluorine can be eluted into the solvent within a short time.

The heat treatment of Step S3 may be performed once. However, since an amount of the fluorine elution into the solvent is saturated, it is desirable that a similar heat treatment is repeated twice or more by exchanging the solvent in the case where an amount of the fluorine elution achieved by performing the heat treatment once is insufficient.

An organic solvent, which exhibits a proper polarity and does not deteriorate the Low-k film, may be selected as the solvent exhibiting a polarity. For example, methanol or isopropyl alcohol (IPA) may be properly used. Water exhibits a polarity and may have an effect of eluting fluorine. However, when water is used, the surface of the Low-k film is altered to be deteriorated and the dielectric constant of the Low-k film is increased.

The conditions for the heat treatment are preferably 2 to 3 atm and 100 to 150 degrees C. (e.g., 120 degrees C.).

After the heat treatment is terminated, dry treatment is performed through a proper method (Step S4), and a series of steps are terminated.

As described above, when the heat treatment is performed using an organic solvent exhibiting a proper polarity like methanol or IPA in such a way that the organic solvent is 100 degrees C. or higher in a compressed state and always stays in contact with a Low-k film in the liquid phase, it is possible to reduce the amount of fluorine within the Low-k film without deteriorating the Low-k film.

Second Embodiment

Figure 3:
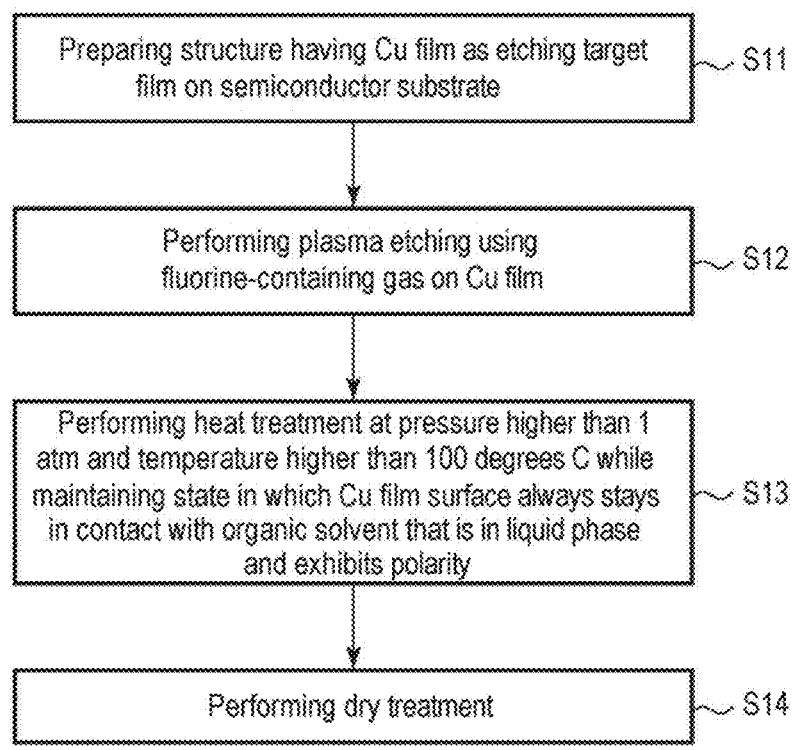
FIG. 3 is a flowchart illustrating a halogen removing method according to a second embodiment of the present disclosure.

FIG. 3 is a flowchart illustrating a halogen removing method according to a second embodiment of the present disclosure.

In a second embodiment, a structure having a Cu film as an etching target film on a semiconductor substrate is prepared (Step S11), and plasma etching using a fluorine-containing gas is performed on the Cu film (Step S12).

By the etching treatment, an etching deposition containing fluorine is formed on the Cu film surface, and fluorine is diffused in the Cu film, so that fluorine remains in the film.

Subsequently, a heat treatment is performed at a pressure higher 1 atm ($1.01 \times 10^5$ Pa) and a temperature higher than 100 degrees C. while maintaining a state such that the Cu film surface always stays in contact with an organic solvent that is in a liquid phase and exhibits a polarity (Step S13). At this time, as in the first embodiment, the apparatus of FIG. 2 may be used.

However, unlike the Low-k film, fluorine inside the film is removed using a chemical reaction. That is, when a heat treatment is performed using an organic solvent (ROH) having a polarity in a compressed state, it is thought that an oxidation-reduction reaction, which is expressed by Equation (1) and is hardly generated at room temperature and atmospheric pressure, is generated.

$$2ROH + CuF_2 \leftrightarrow 2R(O) + Cu + 2HF \qquad (1)$$

More specifically, when heating is performed at a high temperature of 100 degrees C. or higher in a compressed state, a reaction on the right side of Equation (1) above is slightly generated such that copper fluoride ($CuF_2$), which is a metal fluoride, is slightly reduced to become Cu, and fluorine is turned into HF to leave the Cu film. At this time, as long as the organic solvent maintains the liquid phase, the higher temperature and pressure result in better reactivity.

The heat treatment of Step S13 may be performed once. However, since the reaction of Equation (1) is slight in degree, it is desirable that the heat treatment is repeated twice or more by exchanging the solvent. When HF produced at the same time of exchanging the solvent (ROH) is removed, the reaction to the right direction is slightly generated again so that the concentration of HF is increased so as to maintain the equilibrium. Accordingly, when the heat treatment is repeated twice or more, an amount of fluorine in the Cu film may be gradually reduced.

As the number of repetition times of the heat treatment may be increased, the removing amount of fluorine can be increased. The number of times of performing the heat treatment may be determined in view of balancing a required fluorine concentration and throughput.

An organic solvent, which exhibits a proper polarity and does not deteriorate the film by the oxidation of CU, may be selected as the solvent exhibiting a polarity. For example, IPA may be properly used. Water or methanol exhibits a polarity and may have an effect of reducing fluorine. However, when water or methanol is used, the oxidation of Cu cannot be sufficiently suppressed.

As in the first embodiment, the conditions for the heat treatment are preferably 2 to 3 atm and 100 to 150 degrees C. (e.g., 120 degrees C.).

After the heat treatment is terminated, a dry treatment is performed through a proper method (Step S14), and a series of steps are terminated.

As described above, the heat treatment is performed using an organic solvent exhibiting a proper polarity like IPA in such a way that the temperature of the organic solvent is 100 degrees C. or higher in a compressed state and the organic solvent always stays in contact with the surface of a Cu film in the liquid phase, so that it is possible to reduce the amount of fluorine within the Cu film while suppressing the oxidation of the Cu film.

Third Embodiment

Figure 4:
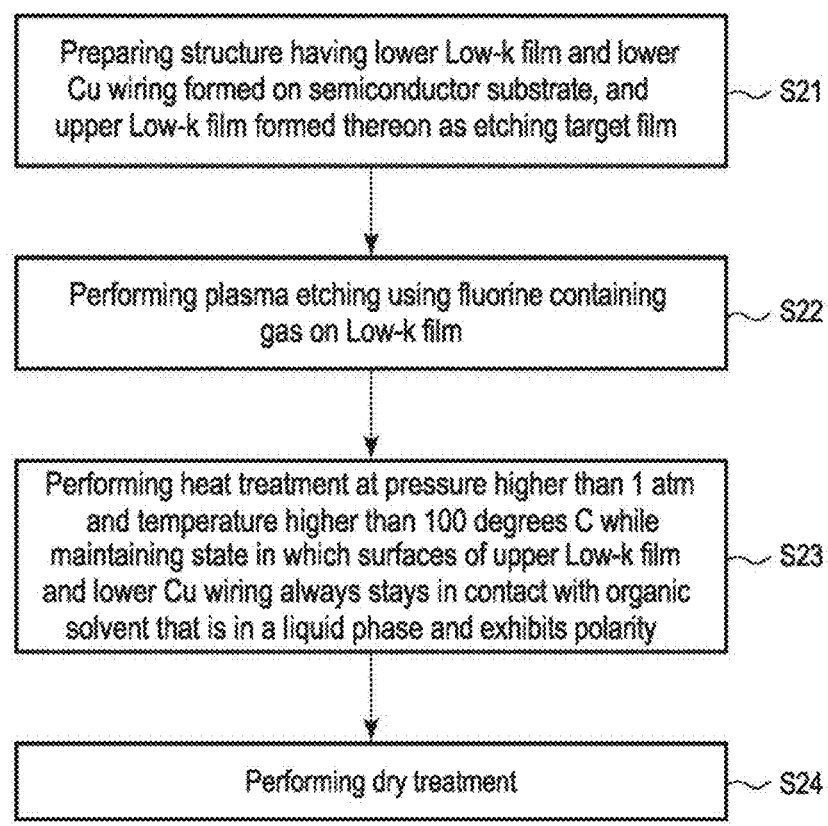
FIG. 4 is a flowchart illustrating a halogen removing method according to a third embodiment of the present disclosure.

FIG. 4 is a flowchart illustrating a halogen removing method according to a third embodiment of the present disclosure.

In the third embodiment, a structure in which a lower Low-k film and a lower Cu wiring (Cu film) are formed on a semiconductor substrate, and an upper Low-k film is formed thereon as an etching target film is prepared (Step S21). Plasma etching is performed by a fluorine-containing gas on the upper Low-k film through a mask of a predetermined pattern so as to expose the lower Cu wiring (Step S22).

By the etching treatment, an etching deposition containing fluorine is formed on the upper Low-k film surface and the lower Cu wiring, and fluorine is diffused in the upper Low-k film and the lower Cu wiring, so that fluorine remains in the upper Low-k film and the lower Cu wiring.

Subsequently, a heat treatment is performed at a pressure higher than 1 atm ($1.01 \times 10^{-5}$ Pa) and a temperature higher than 100 degrees C. while causing the upper Low-k film surface and the lower Cu wiring to always stay in contact with an organic solvent that is in a liquid phase and exhibits a polarity (Step S23). At this time, as in the first embodiment, the apparatus of FIG. 2 may be used.

By this, with respect to the upper Low-k film, like the Low-k film of the first embodiment, the fluorine inside the film is removed through the diffusion of fluorine into the solvent without using a chemical reaction, and with respect to the lower Cu wiring, like the Cu film of the second embodiment, the fluorine inside the wiring is removed by using the oxidation-reduction reaction of Equation (1).

The heat treatment of Step S23 may be performed once. However, when the reduction amount of fluorine is insufficient with the heat treatment performed once, it is desirable to perform the heat treatment twice or more.

An organic solvent, which exhibits a proper polarity and does not deteriorate a Low-k film while suppressing the oxidation of Cu, may be selected as an organic solvent to be used in the third embodiment. For example, IPA may be properly used. As described above, water or methanol also exhibits a polarity and may have an effect of reducing fluorine. However, when water or methanol is used, the oxidation of Cu (change into copper oxide) cannot be sufficiently suppressed.

As in the first embodiment, the conditions forth eat treatment are also preferably 2 to 3 atm and 100 to 150 degrees C. (e.g., 120 degrees C.) in the third embodiment.

After the heat treatment is terminated, a dry treatment is performed through a proper method (Step S24), and a series of steps are terminated.

As described above, the heat treatment is performed using an organic solvent exhibiting a proper polarity like IPA in such a way that the temperature of the organic solvent is 100 degrees C. or higher in a compressed state and the organic solvent always stays in contact with the surface of an upper Low-k film and the lower Cu wiring in the liquid phase, so that it is possible to reduce the amount of fluorine of the upper Low-k film surface and the lower Cu wiring while suppressing the deterioration of the upper Low-k film and the oxidation of the lower Cu wiring.

Experiment Example

Subsequently, experiment examples will be described.

Experiment Example 1

Figure 5:
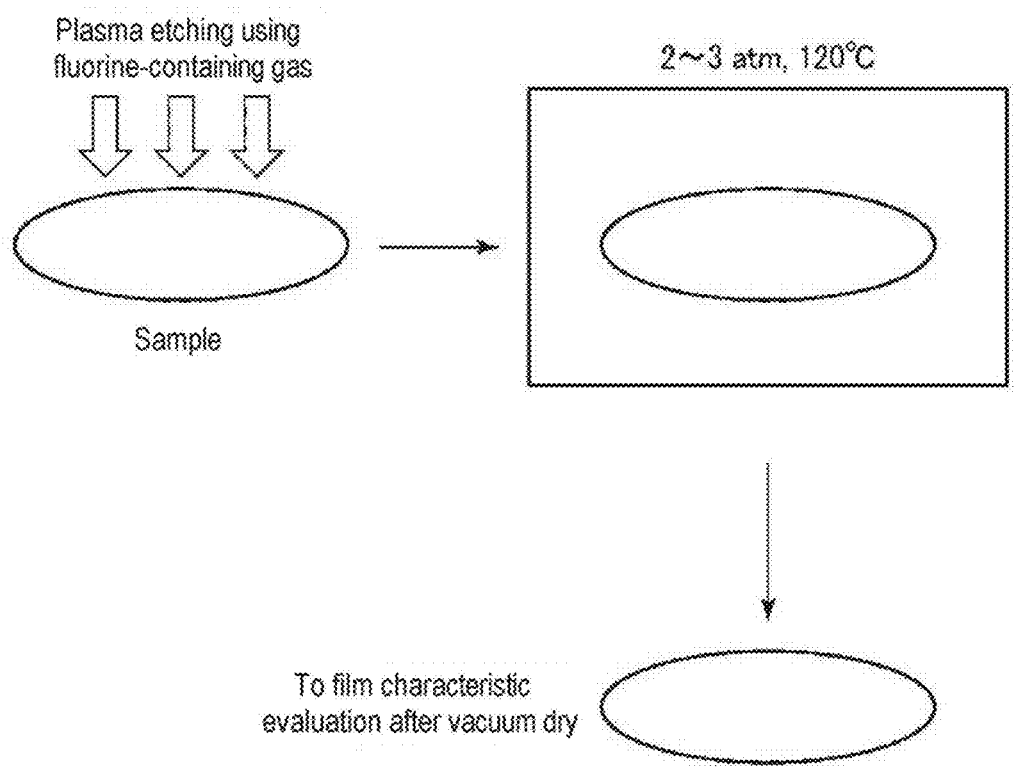
FIG. 5 is a view illustrating a flow in an experiment example.

Here, a plurality of samples, each of which was obtained by forming a blanket Low-k film (SiCHO) on a Si substrate, were prepared, and a plasma etching treatment was performed on the Low-k film by using an ordinary $C_xF_y$ series etching gas as the fluorine-containing gas until the film thickness of each Low-k film was reduced by about half Heating treatment was performed on the samples in the solvents of three types of conditions in an autoclave, and then vacuum drying was performed at 200 degrees C. (Samples 1 to 3). FIG. 5 illustrates a flow of the experiment, and FIG. 6 represents heat treatment conditions of Samples 1 to 3.

Sample 1 was subjected to treatment under the following conditions: using pure water as a solvent, pressure: 2 to 3 atm, temperature: 120 degrees C., and time duration: 12 hours, which was performed three times while a cooling and solvent exchange process is interposed therebetween. Sample 2 was subjected to a treatment under the following conditions: using methanol as a solvent, pressure: 2 to 3 atm, temperature: 120 degrees C., and time duration: 12 hours, which was performed twice while a cooling and solvent exchange process is interposed therebetween. Then, the solvent was replaced by pure water, and a cleaning treatment was performed for about 10 minutes at atmospheric pressure and a temperature of 50 degrees C. Sample 3 was subjected to a treatment under the following conditions: using pure water as a solvent, pressure: 2 to 3 atm, temperature: 120 degrees C., and time duration: 36 hours, which was performed once.

A degassing amount of fluorine F and a degassing amount of water ($H_2O$) to a temperature were measured by a temperature rising desorption gas analyzer with respect to Samples 1 to 3 in Experiment Example 1 and a sample directly after etching The results are represented in FIGS. 7A and 7B, FIG. 7A is a diagram showing a degassing amount of F to a temperature, and FIG. 7B is a diagram showing a degassing amount of $H_2O$ to a temperature.

As illustrated in FIG. 7A, from Samples 1 and 3 on which the heat treatment was performed using pure water, it can be seen that the degassing amount of F is reduced until a high temperature, compared to that directly after etching so that F is removed although incomplete. From Sample 2, on which the heat treatment was performed using methanol, it can be seen that a certain F removing effect is achieved since the degassing amount of F is reduced until 500 degrees C. However, a degassing component of a higher temperature than the heat treatment temperature has not been sufficiently removed.

In addition, as illustrated in FIG. 7B, it can be seen that Samples 1 and 3, on which the heat treatment was performed using pure water, have a large degassing amount of $H_2O$, and in particular, in Sample 3, which has been continuously treated, the degassing amount is greatly increased. It is believed that this is due to the fact that the film has deteriorated and been absorbed. Whereas, it can be seen that Sample 2 on which the heating treatment was performed using methanol has a lower degassing amount of $H_2O$ compared to Samples 1 and 3, in particular, at the lower temperature side.

Figure 8:
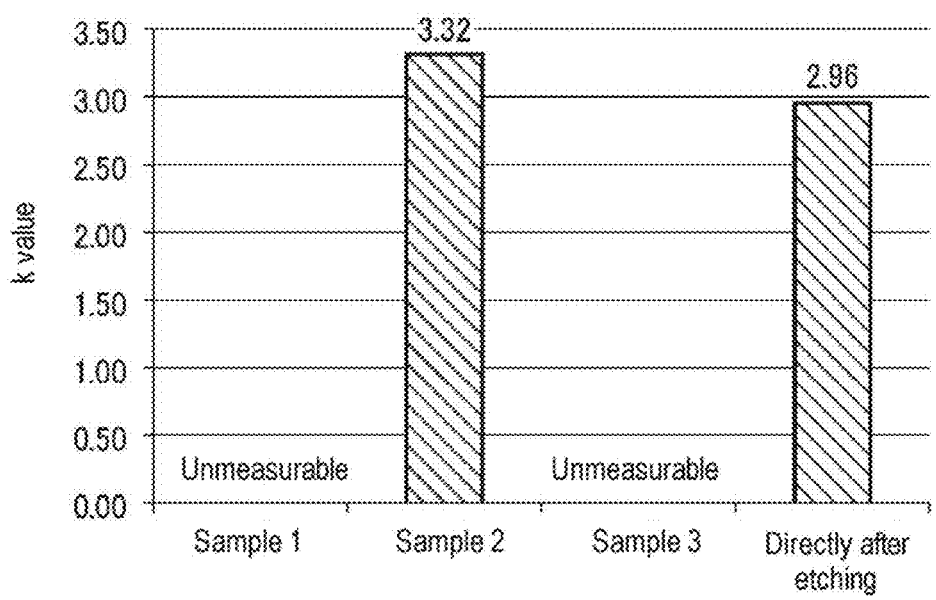
FIG. 8 is a diagram representing results that were obtained by measuring k values with respect to Samples 1 to 3 in Experiment Example 1 and a sample directly after etching.
Figure 9:
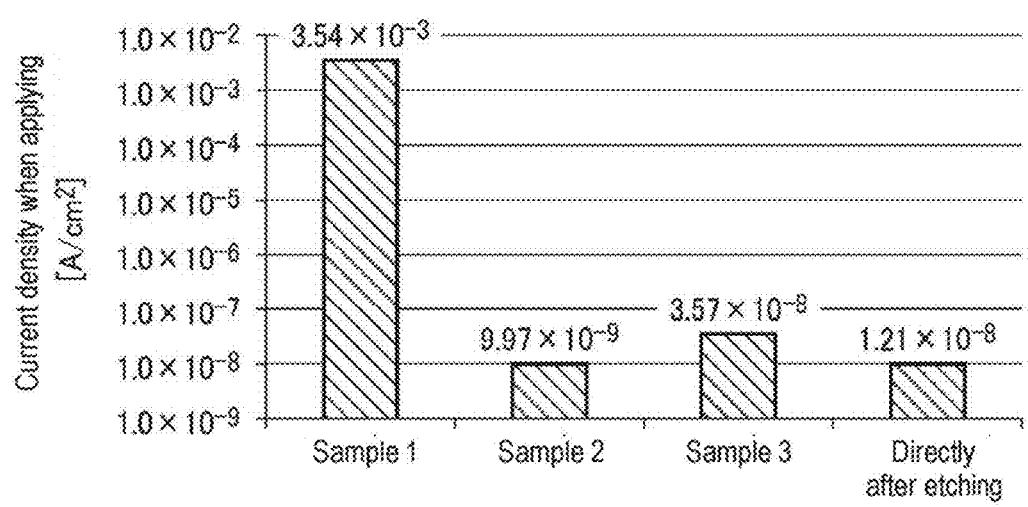
FIG. 9 is a diagram showing current densities of Samples 1 to 3 in Experiment Example 1 and a sample directly after etching when an electric field of 1 MV/cm was applied thereto.

Subsequently, electric characteristics were evaluated for Samples 1 to 3 and a sample directly after the etching. FIG. 8 is a diagram showing results that were obtained by measuring the k value of the Low-k film of each sample, and FIG. 9 is a view representing a current density of each sample when an electric field of 1 MV/cm was applied.

As illustrated in these figures, with respect to Samples 1 and 3 on which the heat treatment was performed using pure water, it was not possible to perform a CV measurement for measuring the k value due to the surface roughness of the Low-k films thereof. In addition, it can be seen that the current density of each of the Low-k films is high, and the insulation property is degraded. From this, it can be seen that the films have deteriorated in Samples 1 and 3. Whereas, in Sample 2 on which the heat treatment was performed using methanol, the k value of the Low-k film is merely slightly increased compared to the sample directly after etching, but the current density was the same as the sample directly after the etching.

Figure 10:
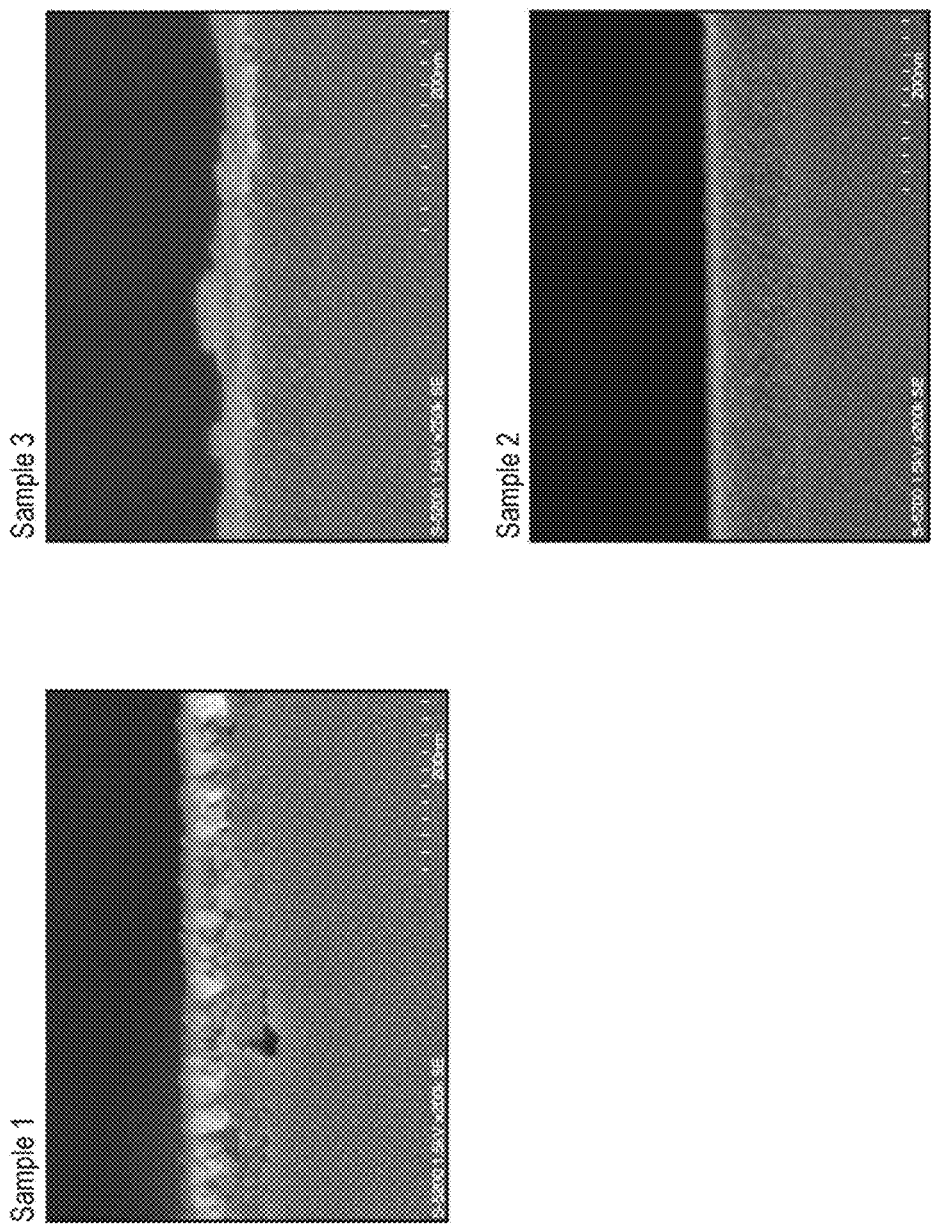
FIG. 10 represents SEM photographs of cross-sections of Samples 1 to 3 in Experiment Example 1.

FIG. 10 represents SEM photographs of cross-sections of Samples 1 to 3. From FIG. 10, it can be seen that Sample 1, on which an intermittent heat treatment was performed using pure water, is formed with two altered layers on the Low-k film, and Sample 3, on which a continuous heat treatment was performed using pure water, is formed with one rough altered layer on the Low-k film surface, but Sample 2, on which a heat treatment was performed using methanol, does not exhibit a change in the Low-k film.

From the results described above, it has been found that an effect of removing fluorine from the Low-k film is high but the Low-k film has deteriorated in Samples 1 and 3, on which the heat treatment was performed using pure water. On the other hand, in Sample 2, on which the heat treatment was performed using methanol, it is possible to obtain the effect of removing fluorine from the Low-k film even though its effect is less than that of Samples 1 and 3, and further the film hardly deteriorated.

Experiment Example 2

Here, as in Experiment Example 1, a sample, which was obtained by forming a blanket Low-k film (SiCHO) on a Si substrate, was prepared, and a plasma etching treatment was performed on the Low-k film using an ordinary $C_xF_y$ series etching gas as the fluorine-containing gas until the film thickness of each Low-k film was reduced by about half. A heat treatment under the conditions illustrated in FIG. 11 was performed in an autoclave using IPA as a solvent, and then vacuum drying was performed at a temperature of 200 degrees C., thereby fabricating Sample 4. Sample 4 was fabricated by substituting the methanol used in Sample 2 with IPA while other conditions were the same as those of Sample 2.

Figure 12:
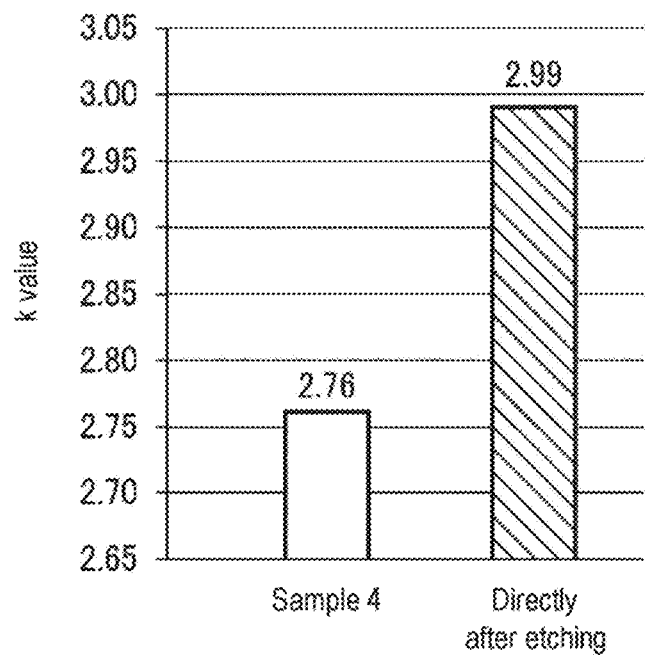
FIG. 12 is a diagram showing results that were obtained by measuring k values of Low-k films with respect to Sample 4 in Experiment Example 2 and a sample directly after etching.

FIG. 12 is a diagram showing results that were obtained by measuring k values of Low-k films with respect to Sample 4 and a sample directly after etching. As illustrated in the figure, Sample 4, on which the heating treatment was performed using IPA, was equivalent to the sample directly after the etching in view of the k value of the Low-k film.

FIGS. 13A and 13B are diagrams showing results that were obtained by measuring a degassing amount of fluorine F and a degassing amount of water ($H_2O$) to a temperature by a temperature rising desorption gas analyzer with respect to Sample 4 and a sample directly after etching, in which FIG. 13A represent the degassing amount of $H_2O$ and FIG. 13B represents the degassing amount of F. From these, it has been found in Sample 4, on which the heating treatment was performed using FPA, that F inside the Low-k film can be removed without deteriorating the film in that the absorption amount is equivalent to that of the sample directly after the etching and the degassing amount of F is small.

Experiment Example 3

Here, a plurality of samples, each of which was obtained by forming a blanket Cu film on a Si substrate, were prepared, and a plasma etching treatment was performed on the Cu film by using an ordinary $C_xF_y$ series etching gas as the fluorine-containing gas. A heat treatment was performed on the samples in the solvents of three types of conditions in an autoclave, and then vacuum drying was performed at a temperature of 200 degrees C. (Samples 5 to 7). The flow of the experiment is the same as that of FIG. 5. Sample 5 was obtained by performing the same heat treatment as that performed on Sample 2 using methanol, Sample 6 was obtained by performing the same heat treatment as that performed on Sample 4 using IPA, and Sample 7 was obtained by performing a heat treatment, using IPA, under the conditions that are equal to the heat treatment conditions applied to Sample 4, except that each IPA treatment time duration was changed to 24 hours. FIG. 14 is a diagram collectively representing the heat treatment conditions for Samples 5 to 7.

A fluorine (F) concentration and an oxygen (O) concentration in a depth direction by an SIMS were measured with respect to Samples 5 to 7, an initial sample before etching, and a sample after etching. The results are represented in FIGS. 15 and 16.

As illustrated in FIG. 15, with respect to the F concentration, it has been found that F is removed from the inside of the Cu film by the heat treatment using methanol or IPA since the F concentration in each of Sample 5 to 7 is reduced in the vicinity of the Cu film compared to the sample after the etching. In addition, as illustrated in FIG. 16 it has been found that the oxidation of the Cu film proceeded in methanol since Sample 5, on which a heat treatment was performed using methanol, has a higher oxygen concentration inside the Cu film while the oxygen concentration in Samples 6 and 7, on which the heat treatment was performed using IPA, do not greatly rise compared to the initial sample.

From the results described above, in the case of a Cu film, it has been found that, while F inside a film may be removed by performing a heat treatment using methanol, the oxidation of the Cu film proceeds such that the Cu film deteriorates, Whereas, it has been found that, when the heat treatment was performed using IPA, F inside a film may be removed, and there is less deterioration of the Cu film through oxidation.

<Other Application>

While the exemplary embodiments of the present disclosure have been described above, the present disclosure may be variously modified without being limited to the above-described embodiments. For example, although the above-described embodiments have illustrated an example of removing fluorine inside the film, it is evident that the other halogens, such as chlorine, can also be removed with the same technique. That is, fluorine is an element that has the smallest radius among the halogens and thus is hard to remove. Thus, in a condition where fluorine is removable, the other halogens are also removable.

In addition, although the above-described embodiments have illustrated an example in which the present disclosure is applied to a Low-k film and Cu, it is possible to remove halogens, such as fluorine, in an Si-containing material other than the Low-k film and a metal other than Cu in the same principle as the Low-k film and Cu.

In addition, although the above-described embodiments have illustrated an example in which a fluorine removing treatment is performed on a film in which fluorine remains by plasma etching using a fluorine-containing gas, the present disclosure is applicable to any material in any treatment without being limited to the plasma etching as long as a halogen remains in the material.

In addition, an example in which a semiconductor substrate is used as a substrate has been described, it is natural that the present disclosure is not limited to the semiconductor substrate in view of the principle thereof.

According to the present disclosure, a heat treatment is performed on a halogen-containing film at a pressure higher than 1 atm and a temperature higher than 100 degrees C. while maintaining astute in which an organic solvent, which is in a liquid phase and exhibits a polarity, stays in contact with a surface of the film. As a result, it is possible to remove the halogen inside the film while suppressing deterioration of the film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of removing a halogen, comprising:
performing a heating treatment on a halogen-containing film at a pressure of 2 to 3 atm and a temperature of 100 to 150 degrees C. in order to suppress a deterioration of the film while keeping an organic solvent, which is in a liquid phase and exhibits a polarity, in contact with a surface of the halogen-containing film such that an amount of a halogen inside the halogen-containing film decreases.

2. The method of claim 1, wherein the halogen-containing film is an Si-containing film.

3. The method of claim 2, wherein the halogen-containing film is a Low-k film formed on a semiconductor substrate, and the halogen is contained in the film by plasma etching using a fluorine-containing gas.

4. The method of claim 2, wherein the halogen inside the halogen-containing film is eluted and removed by being diffused into the organic solvent, which exhibits a polarity, without going through with a chemical reaction.

5. The method of claim 2, wherein the organic solvent, which exhibits a polarity, is methanol or isopropyl alcohol.

6. The method of claim 1, wherein the halogen-containing film is a metal film.

7. The method of claim 6, wherein the halogen-containing film is a Cu film formed on a semiconductor substrate, and the halogen is contained in the film by plasma etching using a fluorine-containing gas.

8. The method of claim 6, wherein the halogen inside the halogen-containing film is removed using a chemical reaction that reduces a metal fluoride inside the film.

9. The method of claim 6, wherein the organic solvent that exhibits a polarity is isopropyl alcohol.

10. The method of claim 1, wherein performing the heating treatment is repeated twice or more by exchanging the organic solvent.

11. The method of claim 1, wherein the halogen is fluorine.

12. A method of manufacturing a semiconductor device, comprising:
preparing a structure having a predetermined film formed on a semiconductor substrate;
performing plasma etching using a fluorine-containing gas on the predetermined film; and
removing fluorine contained in the predetermined film by the plasma etching,
wherein removing the fluorine performs a heating treatment on the predetermined film at a pressure of 2 to 3 atm and a temperature of 100 to 150 degrees C. in order to suppress a deterioration of the predetermined film while keeping an organic solvent, which is in a liquid phase and exhibits a polarity, in contact with a surface of the predetermined film such that an amount of the fluorine inside the predetermined film decreases.

13. The method of claim 12, wherein the predetermined film is a Low-k film.

14. The method of claim 13, wherein the fluorine inside the predetermined film is eluted and removed by being diffused into the organic solvent, which exhibits polarity, without going through with a chemical reaction.

15. The method of claim 13, wherein the organic solvent, which exhibits a polarity, is methanol or isopropyl alcohol.

16. The method of claim 12, wherein the predetermined film is a Cu film.

17. The method of claim 16, wherein the fluorine inside the predetermined film is removed using a chemical reaction that reduces $CuF_2$ inside the predetermined film.

18. The method of claim 16, wherein the organic solvent, which exhibits a polarity, is isopropyl alcohol.

19. A method of manufacturing a semiconductor device, comprising:
preparing a structure having a lower Low-k film and a lower Cu wiring formed on a semiconductor substrate, and an upper Low-k film formed thereon as an etching target film;
performing plasma etching using a fluorine-containing gas on the upper Low-k film; and
removing fluorine contained in the upper Low-k film and the lower Cu wiring by the plasma etching,
wherein removing the fluorine performs a heating treatment on the upper Low-k film and the lower Cu wiring at a pressure of 2 to 3 atm and a temperature of 100 to 150 degrees C. in order to suppress a deterioration of the upper Low-k film and the lower Cu wiring while keeping an organic solvent, which is in a liquid phase and exhibits a polarity, in contact with a surface of the upper Low-k film such that an amount of the fluorine inside the upper Low-k film and the lower Cu wiring decreases.

20. The method of claim 19, wherein the organic solvent, which exhibits a polarity, is isopropyl alcohol.

21. The method of claim 12, wherein removing the fluorine repeats the heating treatment twice or more by exchanging the organic solvent.

* * * * *